United States Patent
Shallal et al.

(10) Patent No.: US 11,443,784 B2
(45) Date of Patent: Sep. 13, 2022

(54) COMMAND BUFFER CHIP WITH DUAL CONFIGURATIONS

(71) Applicant: Rambus Inc., San Jose, CA (US)

(72) Inventors: Aws Shallal, Cary, NC (US); Larry Grant Giddens, Raleigh, NC (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 17/284,433

(22) PCT Filed: Oct. 7, 2019

(86) PCT No.: PCT/US2019/055028
§ 371 (c)(1),
(2) Date: Apr. 9, 2021

(87) PCT Pub. No.: WO2020/076718
PCT Pub. Date: Apr. 16, 2020

(65) Prior Publication Data
US 2021/0343318 A1    Nov. 4, 2021

Related U.S. Application Data (60) Provisional application No. 62/744,980, filed on Oct. 12, 2018.

(51) Int. Cl.
*G11C 7/10* (2006.01)
*G11C 7/22* (2006.01)
*G11C 11/4093* (2006.01)

(52) U.S. Cl.
CPC ............ *G11C 7/109* (2013.01); *G11C 7/1045* (2013.01); *G11C 7/1087* (2013.01); *G11C 7/222* (2013.01); *G11C 7/225* (2013.01); *G11C 11/4093* (2013.01)

(58) Field of Classification Search
CPC ..... G11C 7/109; G11C 7/1045; G11C 7/1087; G11C 7/222; G11C 7/225
See application file for complete search history.

(56) References Cited

U.S. PATENT DOCUMENTS 7,076,600 B2    7/2006 Gavin
2009/0049267 A1    2/2009 Perner et al.
(Continued)

OTHER PUBLICATIONS

Notification of Transmittal of the International Search Report and the Written Opinion of the International Searching Authority, or the Declaration with dated Jan. 10, 2020 re: Int'l Appln. No. PCT/US2019/055028. 16 Pages.

*Primary Examiner* — Han Yang
(74) *Attorney, Agent, or Firm* — Lowenstein Sandler LLP (57) ABSTRACT

A buffer chip includes a first set of input/output (I/O) pins a second set of I/O pins, and is configurable to operate in one of a first mode or a second mode. The first set of I/O pins and the second set of I/O pins are configured to convey first signals between the buffer chip and one or more volatile memory devices on a memory module when the buffer chip is configured to operate in the first mode. The first set of I/O pins is configured to convey the first signals between the buffer chip and the one or more volatile memory devices and the second set of I/O pins is configured to convey second signals between more non-volatile memory devices on the memory module when the buffer chip is configured to operate in the second mode.

20 Claims, 8 Drawing Sheets

(56) References Cited

U.S. PATENT DOCUMENTS

| | | | |
|---|---|---|---|
| 2009/0235012 A1* | 9/2009 | Rosner | G11C 7/10 |
| | | | 711/E12.008 |
| 2010/0125681 A1 | 5/2010 | Patel | |
| 2013/0033954 A1 | 2/2013 | Shaeffer | |
| 2013/0077382 A1* | 3/2013 | Cho | G06F 12/0638 |
| | | | 365/148 |
| 2013/0329491 A1* | 12/2013 | Chang | G11C 11/005 |
| | | | 365/185.03 |
| 2014/0082260 A1* | 3/2014 | Oh | G06F 13/1668 |
| | | | 711/103 |
| 2017/0109058 A1* | 4/2017 | Shallal | G06F 3/0685 |
| 2021/0132856 A1* | 5/2021 | Chen | G06F 30/39 |

* cited by examiner

COMMAND BUFFER CHIP WITH DUAL CONFIGURATIONS

BACKGROUND

Modern computer systems generally include a data storage device, such as a memory component. The memory component may be, for example a random access memory (RAM) or a dynamic random access memory (DRAM). The memory component includes memory banks made up of storage cells which are accessed by a memory controller or memory client through a command interface and a data interface within the memory component.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

In various embodiments, a single command buffer chip, such as a register clock driver (RCD) chip, may be configured in either a first configuration or a second configuration for use in different types of memory modules. Depending on the configuration, certain sets of input/output (I/O) pins on the command buffer chip may be configured for communication with different components on the respective memory module. For example, in the first configuration the command buffer chip may be configured for use in a dual in-line memory module (DIMM) comprising a series of dynamic random access memory (DRAM) integrated circuits, such as a registered DIMM (RDIMM) or a load reduced DIMM (LRDIMM). In the first configuration (i.e., when the command buffer chip is configured to operate in a first mode), both a first set of the I/O pins and a second set of the I/O pins may be configured to convey signals between the command buffer chip and the DRAM devices of the DIMM. In the second configuration, however, the command buffer chip may be configured for use in a hybrid non-volatile DIMM (NVDIMM), such as a non-volatile RDIMM (NVRDIMM) or a non-volatile LRDIMM (NVLRDIMM). In the second configuration (i.e., when the command buffer chip is configured to operate in a second mode), the first set of the I/O pins may still be configured to convey signals between the command buffer chip and the DRAM devices of the NVDIMM, but the second set of the I/O pins may be configured to convey signals between the command buffer chip and a non-volatile memory controller coupled to one or more non-volatile memory devices of the NVDIMM. The second set of the I/O pins may thus be used to form a local communication (LCOM) interface between the command buffer chip and the non-volatile memory controller.

Thus, in various embodiments, depending on the configuration of the command buffer chip, certain I/O pins which are be used for a DRAM interface in one configuration, can be repurposed and used to form a LCOM interface between the command buffer chip and a non-volatile memory controller in another configuration. In one embodiment, the LCOM interface is a sideband interface used to access the command buffer chip independently or in tandem with the host memory controller. The techniques described herein allow for a single command buffer chip to be manufactured which can then be used in either a DRAM DIMM or an NV DIMM, depending on the configuration. As a result, I/O pins can be repurposed to provide an LCOM interface without necessarily adding any additional package pins to the command buffer chip. Additional details of the command buffer chip with dual configurations are provided below with respect to FIGS. 1-9.

Figure 1:
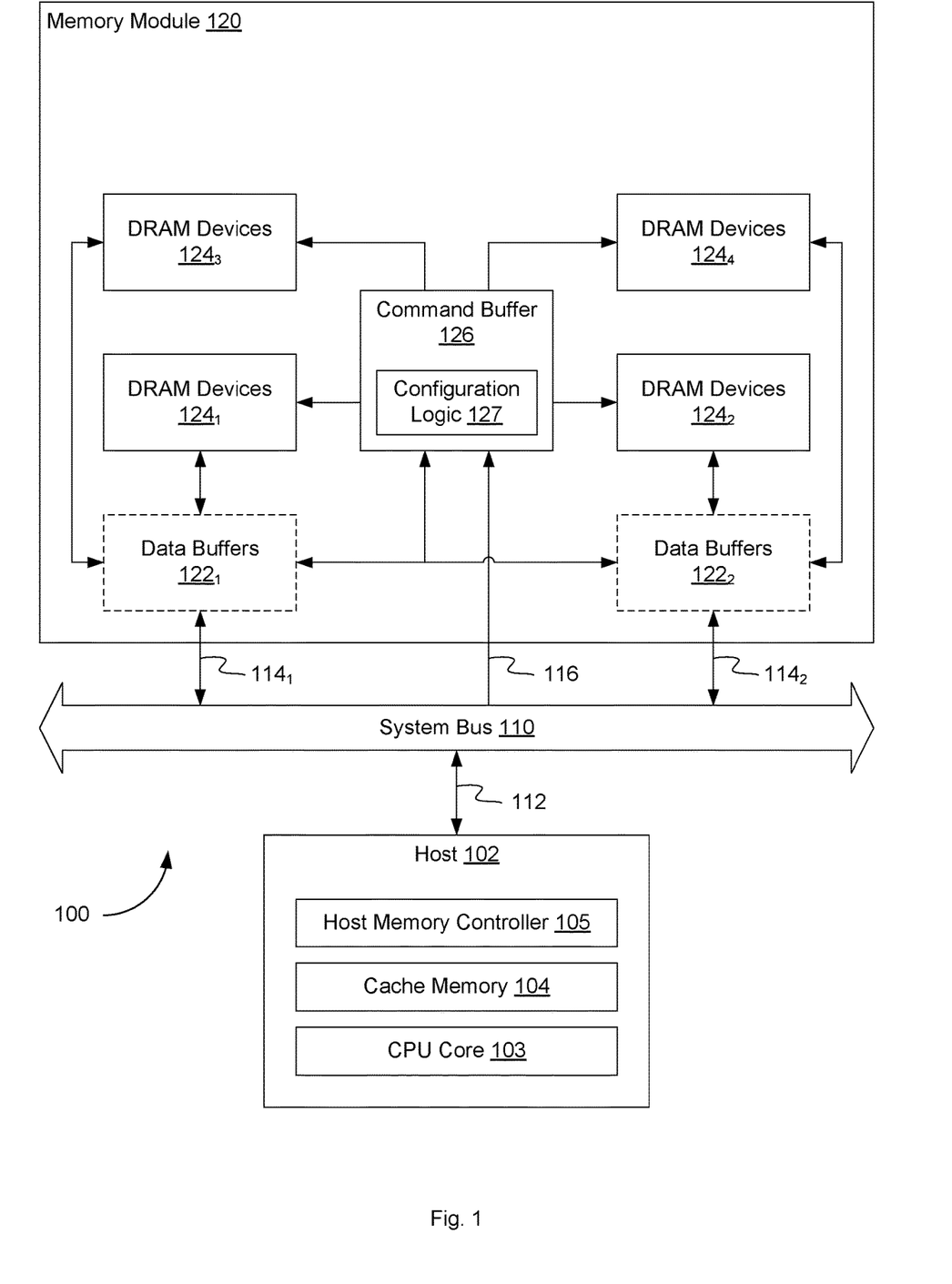
FIG. 1 is a block diagram illustrating a computing environment with a memory module including a command buffer chip with dual configurations, according to an embodiment.

FIG. 1 depicts an environment 100 showing a memory module 120. As an option, one or more instances of environment 100 or any aspect thereof may be implemented in the context of the architecture and functionality of the embodiments described herein.

As shown in FIG. 1, environment 100 comprises a host 102 coupled to a memory module 120 through a system bus 110. In one embodiment, memory module 120 is a dual in-line memory module (DIMM). Such memory modules can be referred to as DRAM DIMMs, registered DIMMs (RDIMMs), or load-reduced DIMMs (LRDIMMs), and can share a memory channel with other DRAM DIMMs.

In on embodiment, the host 102 further comprises a CPU core 103, a cache memory 104, and a host memory controller 105. Host 102 can comprise multiple instances each of CPU core 103, cache memory 104, and host memory controller 105. The host 102 of environment 100 can further be based on various architectures (e.g., Intel x86, ARM, MIPS, IBM Power, etc.). Cache memory 104 can be dedicated to the CPU core 103 or shared with other cores. The host memory controller 105 of the host 102 communicates with the memory module 120 through the system bus 110 using a physical interface 112 (e.g., compliant with the JEDEC DDR3, DDR4 or DDR5 SDRAM standard, etc.). Specifically, the host memory controller 105 can write data to and/or read data from multiple sets of DRAM devices $124_1$-$124_4$ using a data bus $114_1$ and a data bus $114_2$, respectively. For example, the data bus $114_1$ and the data bus $114_2$ can transmit the data as electronic signals such as a data signal, a chip select signal, or a data strobe signal. The DRAM devices $124_1$-$124_4$ can each comprise an array of eight or nine memory devices (e.g., SDRAM) arranged in various topologies (e.g., AB sides, single-rank, dual-rank, quad-rank, etc.). In some cases, as shown, the data to and/or from the DRAM devices $124_1$-$124_4$ can optionally be buffered by a set of data buffers $122_1$ and data buffers $122_2$, respectively. Such data buffers can serve to boost the drive of the signals (e.g., data or DQ signals, etc.) on the system bus 110 to help mitigate high electrical loads of large computing and/or memory systems. In other embodiments, data buffers $122_1$ and data buffers $122_2$ are not present in memory module 120.

Figure 2:
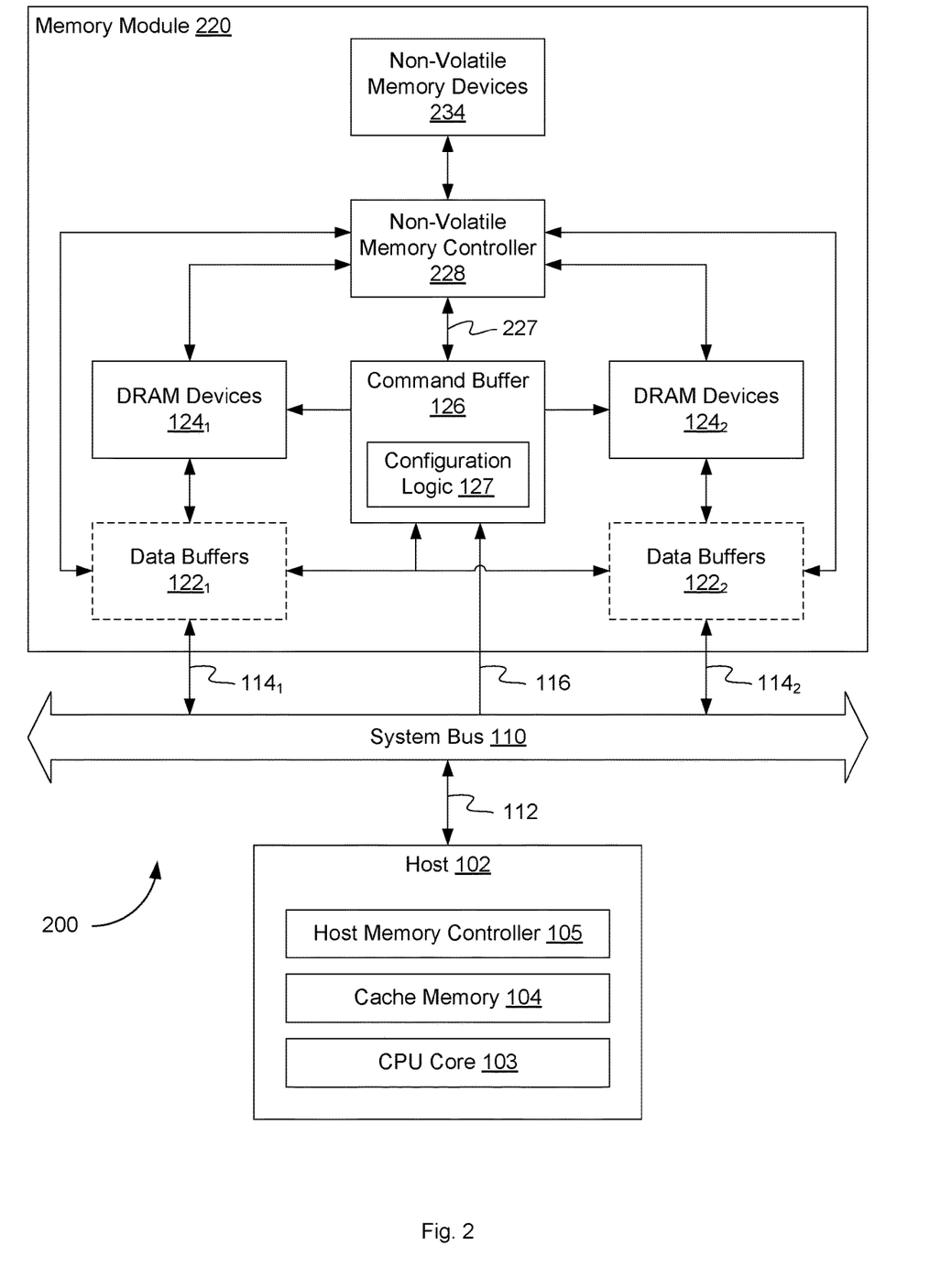
FIG. 2 is a block diagram illustrating a computing environment with a hybrid memory module including a command buffer chip with dual configurations, according to an embodiment.

Further, commands from the host memory controller 105 can be received by a command buffer 126, such as a register clock driver (RCD), at the memory module 120 using a command and address (CA) bus 116. For example, the command buffer 126 might be an RCD such as included in registered DIMMs (e.g., RDIMMs, LRDIMMs, etc.). Command buffers such as command buffer 126 can comprise a logical register and a phase-lock loop (PLL) to receive and re-drive command and address input signals from the host memory controller 105 to the DRAM devices on a DIMM (e.g., DRAM devices $124_1$, DRAM devices $124_2$, etc.), reducing clock, control, command, and address signal loading by isolating the DRAM devices from the host memory controller 105 and the system bus 110. In some cases, certain features of the command buffer 126 can be programmed with configuration and/or control settings. In one embodiment, command buffer 126 has a first set of I/O pins that are configured to convey signals between command buffer 126 and DRAM devices $124_1$-$124_2$ and a second set of I/O pins. Depending on a mode of operation or a configuration of command buffer 126, the second set of I/O pins can be configured to convey signals to different components of the memory module 120. In one embodiment, the mode of operation or configuration of command buffer 126 is controlled by configuration logic 127 within command buffer 126. As described below with respect to FIGS. 7A-7C, the mode of operation or configuration can be set in response to an externally received signal and configuration logic 127 can implement the mode of operation or configuration. For example, configuration logic 127 can configure the second set of I/O pins of the command buffer 126 to convey signals between command buffer 126 and DRAM devices $124_3$-$124_4$ in a first mode of operation (as illustrated in FIG. 1), and can configure the second set of I/O pins to convey signals between command buffer 126 and some other component of memory module 120 in a second mode of operation. For example, FIG. 2 illustrates the same command buffer 126 implemented in another memory module 220 and having the second set of I/O pins configured by configuration logic 127 to convey signals between command buffer 126 and a non-volatile memory controller 228. In other embodiments, in addition or in the alternative, memory module 120 may include other volatile memory devices, such as synchronous DRAM (SDRAM), Rambus DRAM (RDRAM), static random access memory (SRAM), etc.

The memory module 120 shown in environment 100 presents merely one partitioning. The specific example shown where the command buffer 126 and the DRAM devices $124_1$-$124_4$ are separate components is purely exemplary, and other partitioning is possible. For example, any or all of the components comprising the memory module 120 and/or other components can comprise one device (e.g., system-on-chip or SoC), multiple devices in a single package or printed circuit board, multiple separate devices, and can have other variations, modifications, and alternatives.

FIG. 2 depicts an environment 200 showing a hybrid memory module 220. As an option, one or more instances of environment 200 or any aspect thereof may be implemented in the context of the architecture and functionality of the embodiments described herein. Also, the environment 200 or any aspect thereof may be implemented in any desired environment.

As shown in FIG. 2, environment 200 comprises a host 102 coupled to a hybrid memory module 220 through a system bus 110. As described above, the host 102 comprises a CPU core 103, a cache memory 104, and a host memory controller 105. The host memory controller 105 can write data to and/or read data from a first set of DRAM devices $124_1$ and a second set of DRAM devices $124_2$ using a data bus $114_1$ and a data bus $114_2$, respectively.

The hybrid memory module 220 shown in FIG. 2 further comprises a non-volatile memory controller 228 coupled to a set of non-volatile memory devices 234. The presence of multiple types of memory technologies (e.g., the non-volatile memory devices 234, such as NAND flash memory chips and volatile memory technologies (e.g., the DRAM devices) together on a DIMM, in part, defines the "hybrid" characteristic of the hybrid memory module 220. Non-volatile DIMMs (NVDIMMs), non-volatile registered DIMMs (NVRDIMMs), and non-volatile load-reduced DIMMs (NVLRDIMMs) are examples of hybrid modules. These hybrid modules can appear as a DRAM DIMM to the system controller (e.g., host memory controller 105) and/or share a memory channel with other DRAM DIMMs.

As described above, commands from the host memory controller 105 can be received by a command buffer 126 at the hybrid memory module 220 using a command and address (CA) bus 116. In one embodiment, command buffer 126 has a first set of I/O pins that are configured to convey signals between command buffer 126 and DRAM devices $124_1$-$124_2$ and a second set of I/O pins that are configured by configuration logic 127 to convey signals between command buffer 126 and non-volatile memory controller 228. Thus, configuration logic 127 implements a second mode of operation of command buffer 127 to configure the second set of I/O pins to convey signals between command buffer 126 and non-volatile memory controller 228. As a result, the second set of the I/O pins forms a LCOM interface between command buffer 126 and non-volatile memory controller 228 to support a physical layer communications protocol such as the LCOM interface protocol defined by JEDEC. In other embodiments, in addition or in the alternative, memory module 120 may include other non-volatile memory devices, such as flash memory, ferroelectric random-access memory (FRAM), magnetoresistive random-access memory (MRAM), phase-change random-access memory (PRAM), resistive random-access memory (RRAM or ReRAM), etc.

The hybrid memory module 220 shown in environment 200 presents merely one partitioning. The specific example shown where the command buffer 126 and the non-volatile memory controller 228 are separate components is purely exemplary, and other partitioning is possible. For example, any or all of the components comprising the hybrid memory module 220 and/or other components can comprise one device (e.g., system-on-chip or SoC), multiple devices in a single package or printed circuit board, multiple separate devices, and can have other variations, modifications, and alternatives.

Figure 3:
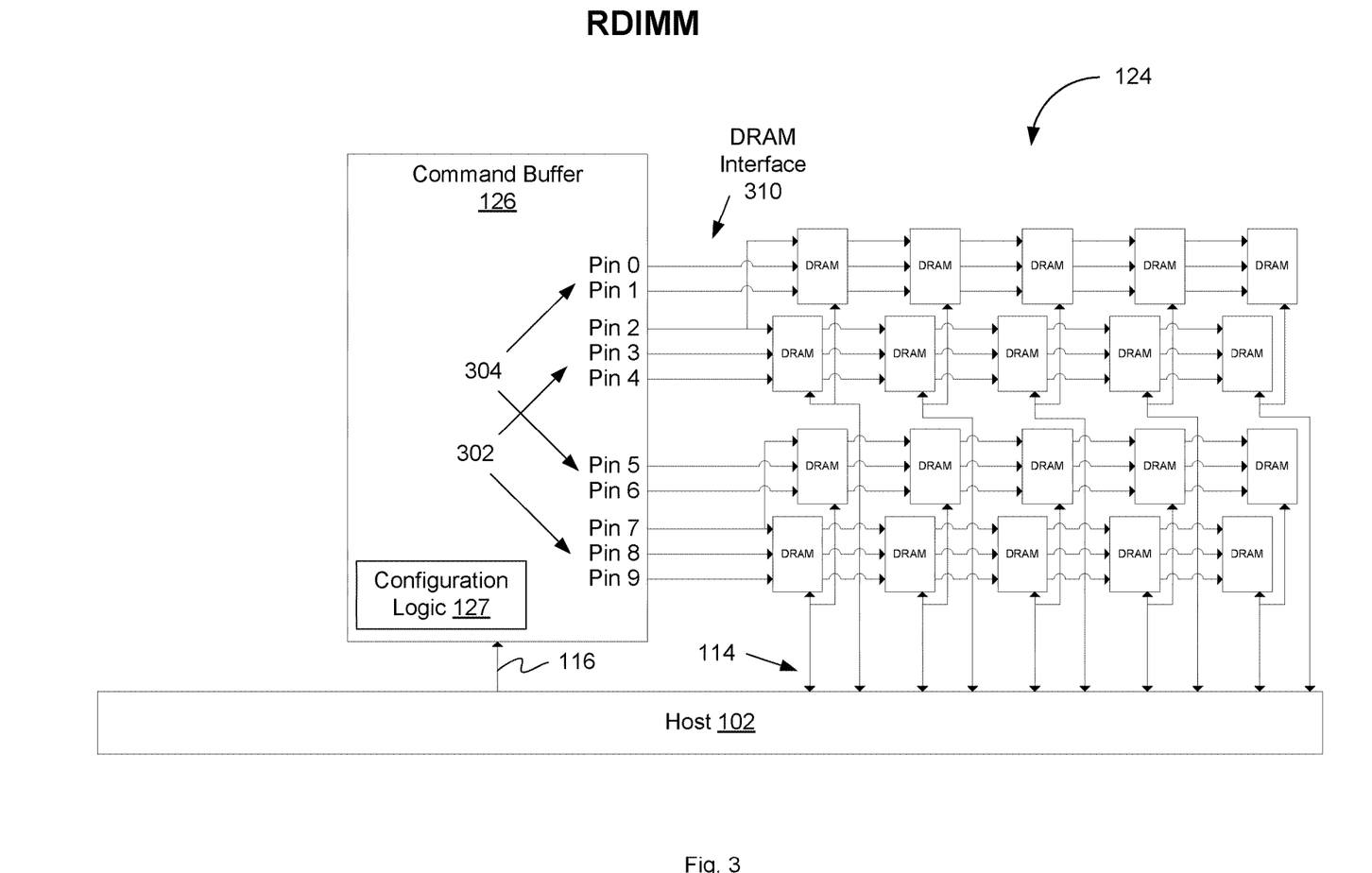
FIG. 3 is a block diagram illustrating a command buffer chip with dual configurations implemented in a registered DIMM, according to an embodiment.

FIG. 3 is a block diagram illustrating a command buffer chip with dual configurations implemented in a registered DIMM, according to an embodiment. As shown in FIG. 3, command buffer 126 includes a number of I/O pins (i.e., Pins 0-9) including a first set 302 of I/O pins (i.e., Pins 2-4 and 7-9) and a second set 304 of I/O pins (i.e., Pins 0-1 and 5-6). The number and arrangement of I/O pins illustrated on command buffer 126 are merely one example, and it should be understood that in other embodiments, command buffer 126 may have some other number and arrangement of I/O pins, including additional or different sets of I/O pins.

In the illustrated embodiment, command buffer 126 is set to a first configuration via a configuration mechanism, as is described in more detail below with respect to FIGS. 7A-7C. In the first configuration, the first set 302 of I/O pins and the second set 304 of I/O pins are both configured by configuration logic 127 to convey signals between the command buffer 126 and one or more volatile memory devices, such as DRAM devices 124. As shown in FIG. 3, command buffer 126 has been implemented in a registered DIMM, which may be one example of memory module 120, as shown in FIG. 1. As such, both the first set 302 of I/O pins (i.e., Pins 2-4 and 7-9) and the second set 304 of I/O pins (i.e., Pins 0-1 and 5-6) are coupled to DRAM devices 124. In one embodiment, the first set 302 of I/O pins is coupled to a first rank of DRAM devices 124 and the second set 304 of I/O pins is coupled to a second rank of DRAM devices 124.

In one embodiment, command buffer 126 can receive commands, addresses, and/or other information from host 102 through C/A interface 116. The command buffer 126 can convey signals (e.g., forward DRAM commands) or otherwise communicate with DRAM devices 124 using an output control/address/command interface 310 implemented using the first set 302 of I/O pins and the second set 304 of I/O pins.

In one embodiment, to implement a first mode of operation (e.g., a volatile mode) in command buffer 126, configuration logic 127 updates an indication of the second set 304 of I/O pins in a pin mapping table for command buffer 126. For example, the pin mapping table may include an indication of whether each I/O pin of command buffer 126 is being used for a DRAM interface 310 or an LCOM interface. Accordingly, configuration logic 127 can set the indication for the second set 304 of I/O pins to indicate that they are being used for DRAM interface 310 and configuration logic 127 can route storage commands directed to DRAM devices 124 on those pins. In another embodiment, to implement the first mode of operation in command buffer 126, configuration logic 127 enables a volatile circuit within configuration logic 127. The volatile circuit may be formed using a multiplexer (MUX) or a number of multiplexers (MUXes) that enable signals to be sent using a specific protocol to DRAM devices 124 via the second set 304 of I/O pins. Upon receiving an indication of the first mode of operation, configuration logic 127 can provide a control signal(s) to the MUX(es) to enable a signal path through the volatile circuit (e.g., enable a signal driver for each of the second set 304 of I/O pins) for the signals to be sent to DRAM devices 124. These signals may include commands designed to perform storage operations (e.g., read, program, erase, pre-charge) on DRAM devices 124. In one embodiment, the interface between the second set 304 of I/O pins and the DRAM devices 124 is a unidirectional interface with the storage commands flowing from command buffer 126 to the DRAM devices 124. In one embodiment, the actual data being written to or read from DRAM devices 124 flows through data buses 114.

Figure 4:
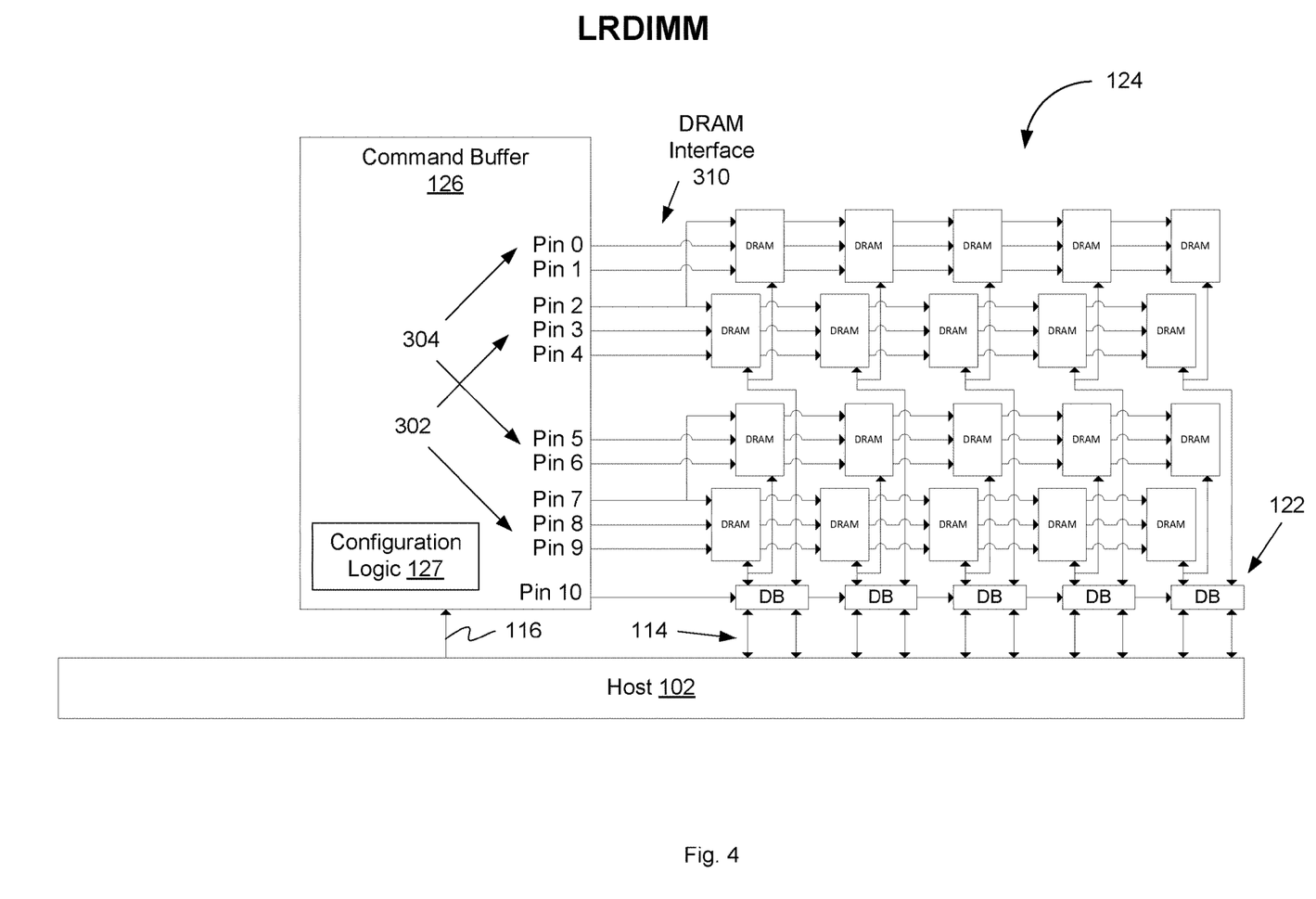
FIG. 4 is a block diagram illustrating a command buffer chip with dual configurations implemented in a load reduced DIMM, according to an embodiment.

FIG. 4 is a block diagram illustrating a command buffer chip with dual configurations implemented in a load reduced DIMM, according to an embodiment. As shown in FIG. 4, command buffer 126 includes a number of I/O pins (i.e., Pins 0-10) including a first set 302 of I/O pins (i.e., Pins 2-4 and 7-9) and a second set 304 of I/O pins (i.e., Pins 0-1 and 5-6). In the illustrated embodiment, command buffer 126 is set to a first configuration where the first set 302 of I/O pins and the second set 304 of I/O pins are both configured by configuration logic 127 to convey signals between the command buffer 126 and DRAM devices 124. As shown in FIG. 4, command buffer 126 has been implemented in a load-reduced DIMM, which may be one example of memory module 120, as shown in FIG. 1. As such, both the first set 302 of I/O pins (i.e., Pins 2-4 and 7-9) and the second set 304 of I/O pins (i.e., Pins 0-1 and 5-6) are coupled to DRAM devices 124. In one embodiment, the first set 302 of I/O pins is coupled to a first rank of DRAM devices 124 and the second set 304 of I/O pins is coupled to a second rank of DRAM devices 124.

In one embodiment, command buffer 126 can receive commands, addresses, and/or other information from host 102 through C/A interface 116. The command buffer 126 can convey signals (e.g., forward DRAM commands) or otherwise communicate with DRAM devices 124 using an output control/address/command interface 310 implemented using the first set 302 of I/O pins and the second set 304 of I/O pins. In addition, the command buffer 126 can also communicate (e.g., send control or data commands) with data buffers 122 using a data buffer control/communication (BCOM) interface using I/O Pin 10.

Figure 5:
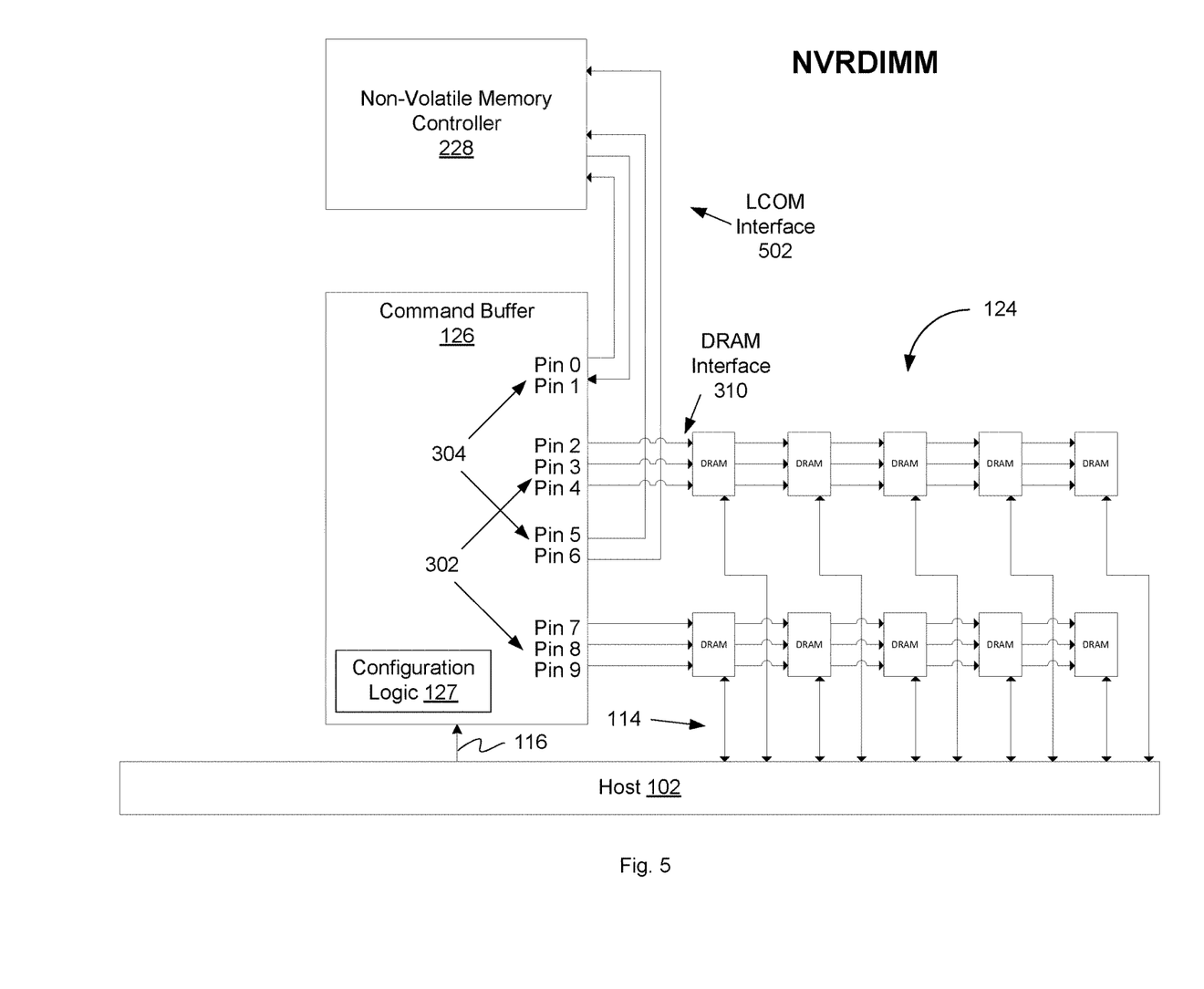
FIG. 5 is a block diagram illustrating a command buffer chip with dual configurations implemented in a non-volatile registered DIMM, according to an embodiment.

FIG. 5 is a block diagram illustrating a command buffer chip with dual configurations implemented in a non-volatile registered DIMM, according to an embodiment. As shown in FIG. 5, command buffer 126 includes a number of I/O pins (i.e., Pins 0-9) including a first set 302 of I/O pins (i.e., Pins 2-4 and 7-9) and a second set 304 of I/O pins (i.e., Pins 0-1 and 5-6). The number and arrangement of I/O pins illustrated on command buffer 126 are merely one example, and it should be understood that in other embodiments, command buffer 126 may have some other number and arrangement of I/O pins, including additional or different sets of I/O pins.

In the illustrated embodiment, command buffer 126 is set to a second configuration via a configuration mechanism, as is described in more detail below with respect to FIGS. 7A-7C. In the second configuration, the first set 302 of I/O pins is configured by configuration logic 127 to convey signals between the command buffer 126 and one or more volatile memory devices, such as DRAM devices 124, while the second set 304 of I/O pins is configured by configuration logic 127 to convey signals between the command buffer 126 and non-volatile memory controller 228. As shown in FIG. 5, command buffer 126 has been implemented in a non-volatile registered DIMM, which may be one example of hybrid memory module 220, as shown in FIG. 2. As such, the first set 302 of I/O pins (i.e., Pins 2-4 and 7-9) is coupled to DRAM devices 124 and the second set 304 of I/O pins (i.e., Pins 0-1 and 5-6) is coupled to non-volatile memory controller 228. In one embodiment, the first set 302 of I/O pins is coupled DRAM devices 124 all having a same rank.

In one embodiment, to implement a second mode of operation (e.g., a non-volatile mode) in command buffer 126, configuration logic 127 updates an indication of the second set 304 of I/O pins in the pin mapping table for command buffer 126. For example, configuration logic 127 can set the indication for the second set 304 of I/O pins to indicate that they are being used for LCOM interface 502 and configuration logic 127 can route storage commands directed to non-volatile memory controller 228 on those pins. In another embodiment, to implement the second mode of operation in command buffer 126, configuration logic 127 enables a non-volatile circuit within configuration logic 127. The non-volatile circuit may be formed using the MUX or MUXes that enable signals to be sent using a specific protocol to non-volatile memory controller 228 via the second set 304 of I/O pins. This non-volatile circuit enables an LCOM interface 502 to enable storage commands to be sent to non-volatile memory controller 228. Upon receiving an indication of the second mode of operation, configuration logic 127 can provide a control signal(s) to the MUX(es) to enable a signal path through the non-volatile circuit (e.g., enable a signal driver and receiver for each of the second set 304 of I/O pins) for the signals to be sent to non-volatile memory controller 228. These signals may include storage commands (e.g., read, program, erase) for non-volatile memory controller 228. In one embodiment, the interface between the second set 304 of I/O pins and the non-volatile memory controller 228 is a bidirectional interface with storage commands or interrupts flowing from command buffer 126 to the non-volatile memory controller 228 as well requests flowing from non-volatile memory controller 228 to command buffer 126. For example, if non-volatile memory controller 228 receives an interrupt from command buffer 126, non-volatile memory controller 228 can then send a request to command buffer 126 to retrieve a command corresponding to the interrupt. In addition, although memory module 220 has less physical DRAM devices 124 than memory module 120 and the second set 304 of I/O pins are used for an interface with non-volatile memory controller 228, there may not actually be less storage capacity in memory module 220. For example, the DRAM devices 124 in memory module 220 may have a higher density to compensate for the lost number of physical devices. As shown in FIG. 2, there may be a direct data path between DRAM devices 124 (and/or data buffers 122) and non-volatile memory controller 228, such that the actual data being transferred between DRAM devices 124 and non-volatile memory controller 228 can bypass command buffer 126.

In one embodiment, command buffer 126 can receive commands, addresses, and/or other information from host 102 through C/A interface 116. The command buffer 126 can convey signals (e.g., forward DRAM commands) or otherwise communicate with DRAM devices 124 using an output control/address/command interface 310 implemented using the first set 302 of I/O pins. The command buffer 126 can further convey signals (e.g., receive local commands) or otherwise communicate with non-volatile memory controller 228 using a local communications (LCOM) interface 502 supporting a physical layer communications protocol such as the LCOM interface protocol defined by JEDEC.

Figure 6:
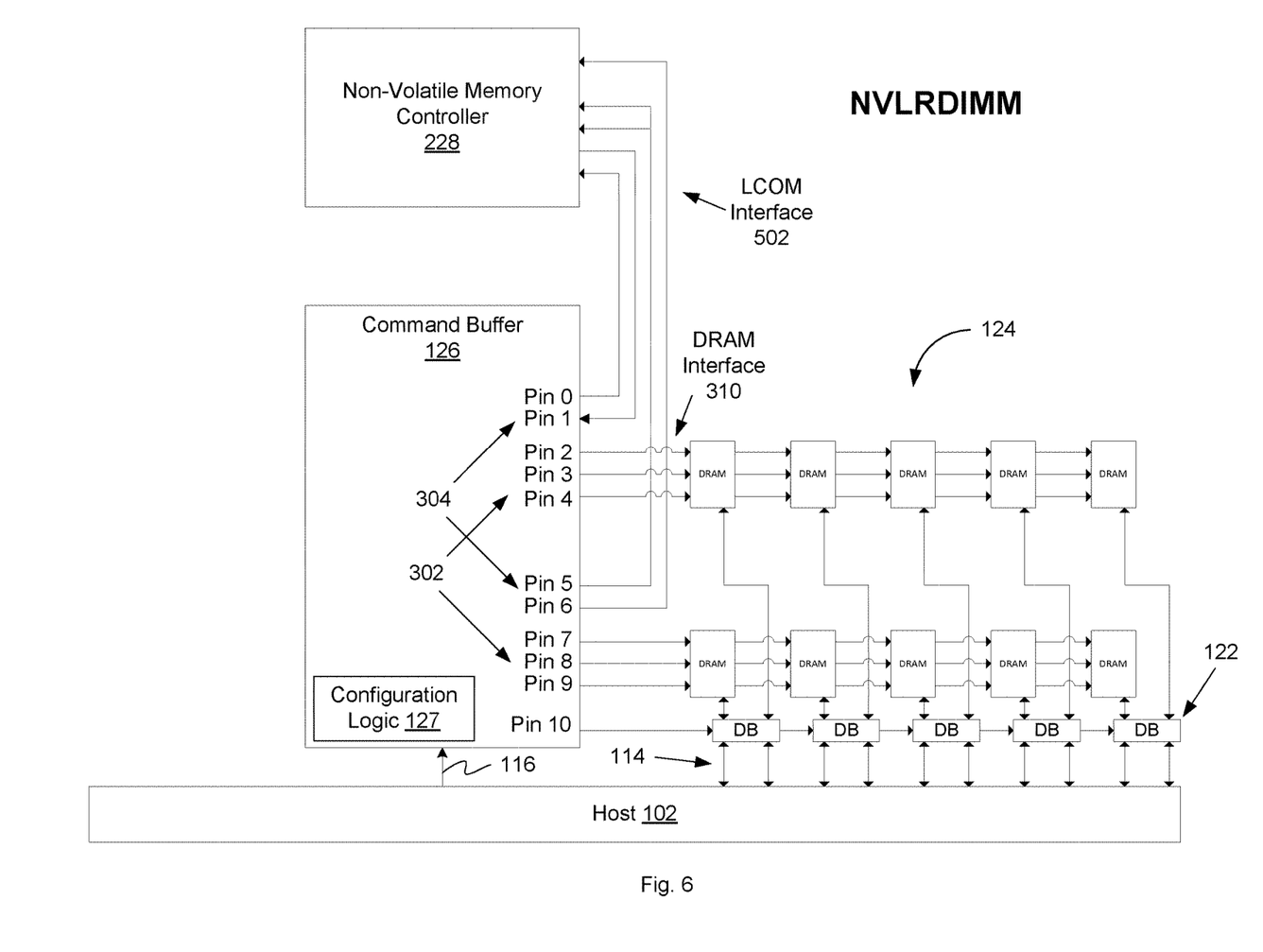
FIG. 6 is a block diagram illustrating a command buffer chip with dual configurations implemented in a non-volatile load reduced DIMM, according to an embodiment.

FIG. 6 is a block diagram illustrating a command buffer chip with dual configurations implemented in a non-volatile load reduced DIMM, according to an embodiment. As shown in FIG. 6, command buffer 126 includes a number of I/O pins (i.e., Pins 0-10) including a first set 302 of I/O pins (i.e., Pins 2-4 and 7-9) and a second set 304 of I/O pins (i.e., Pins 0-1 and 5-6). In the illustrated embodiment, command buffer 126 is set to a second configuration where the first set 302 of I/O pins is configured by configuration logic 127 to convey signals between the command buffer 126 and DRAM devices 124, while the second set 304 of I/O pins is configured by configuration logic 127 to convey signals between the command buffer 126 and non-volatile memory controller 228. As shown in FIG. 6, command buffer 126 has been implemented in a non-volatile load-reduced DIMM, which may be one example of hybrid memory module 220, as shown in FIG. 2. As such, the first set 302 of I/O pins (i.e., Pins 2-4 and 7-9) is coupled to DRAM devices 124 and the second set 304 of I/O pins (i.e., Pins 0-1 and 5-6) is coupled to non-volatile memory controller 228. In one embodiment, the first set 302 of I/O pins is coupled DRAM devices 124 all having a same rank.

In one embodiment, command buffer 126 can receive commands, addresses, and/or other information from host 102 through C/A interface 116. The command buffer 126 can convey signals (e.g., forward DRAM commands) or otherwise communicate with DRAM devices 124 using an output control/address/command interface 310 implemented using the first set 302 of I/O pins. The command buffer 126 can further convey signals (e.g., receive local commands) or otherwise communicate with non-volatile memory controller 228 using a local communications (LCOM) interface 502 supporting a physical layer communications protocol such as the LCOM interface protocol defined by JEDEC. In addition, the command buffer 126 can also communicate (e.g., send control or data commands) with data buffers 122 using a data buffer control/communication (BCOM) interface using I/O Pin 10.

Figure 7A:
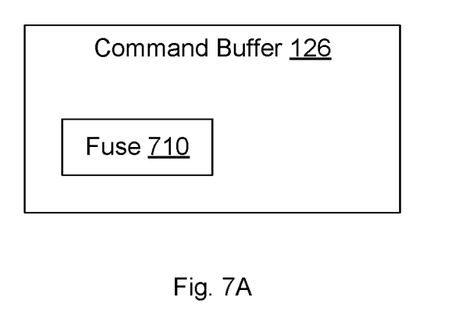
FIGS. 7A-7C are block diagrams illustrating various mechanisms for setting a configuration state of a command buffer chip, according to an embodiment.
Figure 7B:
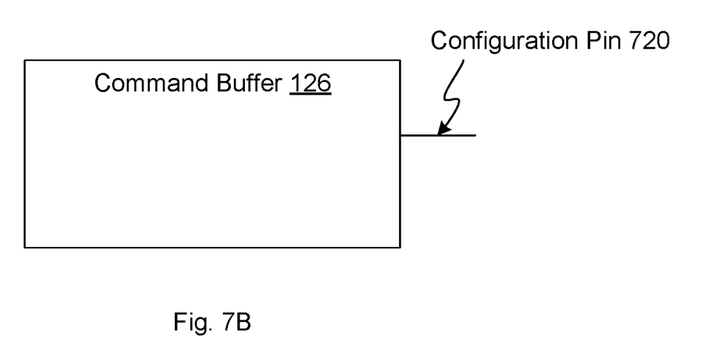
Figure 7C:
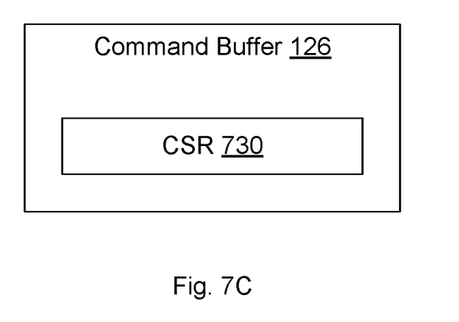

FIGS. 7A-7C are block diagrams illustrating various mechanisms for setting a configuration state of a command buffer chip, according to an embodiment. As shown in FIG. 7A, in one embodiment, command buffer 126 comprises at least one fuse 710. A status of the fuse (i.e., either not blown or blown) can indicate whether command buffer 126 is set to either a first configuration or a second configuration. For example, when fuse 710 has a first status (e.g., not blown), command buffer 126 is set to the first configuration and when fuse 710 has a second status (e.g., blown), command buffer 126 is set to the second configuration. In another embodiment, the status of the fuse 710 and the corresponding configurations may be reversed, such that the first status (e.g., not blown) indicates the second configuration and the second status (e.g., blown) indicates the first configuration. In one embodiment, fuse 710 may be an electrical device having a relatively low resistance that completes an electric path when intact (i.e., not blown) and is designed to break the electric path (i.e., blown) when a relatively high electric current is applied. In another embodiment, fuse 710 may be an eFuse including a computer logic value that is "etched" or "hard-coded" onto a chip and cannot be changed after manufacture. With an eFuse, a first value (e.g., 0) may represent the first status of the fuse 710 and a second value (e.g., 1) may represent the second status of the fuse 710. In one embodiment, the status of fuse 710 is set during manufacture of the command buffer 126 depending on whether the command buffer is intended to be used in a DRAM memory module 120 or a hybrid memory module 220.

As shown in FIG. 7B, in one embodiment, command buffer 126 comprises a configuration pin 720. A level of a signal (i.e., either low or high) driven on configuration pin 720 can indicate whether command buffer 126 is set to either a first configuration or a second configuration. For example, when configuration pin 720 is driven with a first signal (e.g., a relatively low signal or a signal below a threshold), command buffer 126 is set to the first configuration and when configuration pin 720 has is driven with a second signal (e.g., a relatively high signal or a signal above a threshold), command buffer 126 is set to the second configuration. In another embodiment, the drive signals and the corresponding configurations may be reversed, such that the first signal (e.g., low) indicates the second configuration and the second signal (e.g., high) indicates the first configuration. In one embodiment, configuration pin 720 may be a designated one of the I/O pins of the command buffer 126, such as one of Pins 0-9, as shown in FIGS. 3-6. In another embodiment, configuration pin 720 may be some other dedicated pin of command buffer 126. In one embodiment, drive signal is applied to configuration pin 720 to set the configuration during manufacture of the command buffer 126 depending on whether the command buffer is intended to be used in a DRAM memory module 120 or a hybrid memory module 220.

As shown in FIG. 7C, in one embodiment, command buffer 126 comprises a control and status register (CSR) 730. A value stored in CSR 730 can indicate whether command buffer 126 is set to either a first configuration or a second configuration. For example, when a first value is stored in CSR 130, command buffer 126 is set to the first configuration and when a second value is stored in CSR 130, command buffer 126 is set to the second configuration. In another embodiment, the stored values and the corresponding configurations may be reversed, such that the first value indicates the second configuration and the second value indicates the first configuration. In one embodiment, the value is stored in CSR 730 to set the configuration during manufacture of the command buffer 126 depending on whether the command buffer is intended to be used in a DRAM memory module 120 or a hybrid memory module 220. In one embodiment, the CSR 730 may be read-only or otherwise locked to prevent the value stored in CSR 730 from being changed after manufacture of the command buffer 126.

Figure 8:
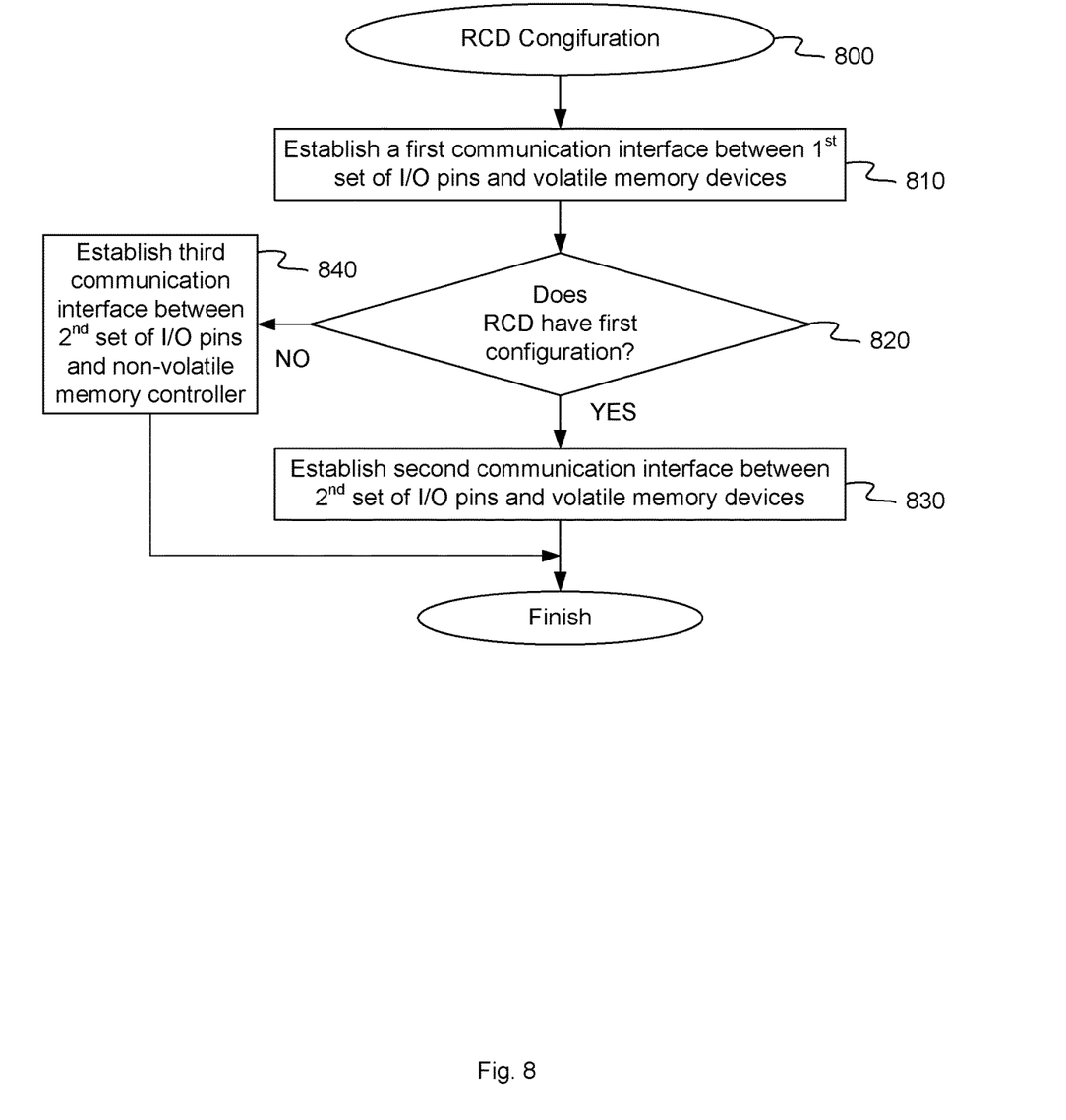
FIG. 8 is a flow diagram illustrating a method for setting a configuration state of a command buffer chip, according to an embodiment.

FIG. 8 is a flow diagram illustrating a method for setting a configuration state of a command buffer chip, according to an embodiment. The method 800 may be performed by processing logic that may comprise hardware (e.g., circuitry, dedicated logic, programmable logic, microcode, etc.), software (e.g., instructions run on a processing device to perform hardware simulation), or a combination thereof. The processing logic may determine a configuration of the command buffer chip and establish communication interfaces between one or more volatile memory devices and/or a non-volatile memory controller as appropriate, depending on the configuration. In one embodiment, the method 500 is performed by command buffer 126, as shown in FIGS. 1-7C.

Referring to FIG. 8, at block 810, method 800 establishes a first communication interface 310 between a first set 302 of I/O pins of command buffer 126 and one or more volatile memory devices, such as DRAM devices 124 on a memory module 220. In one embodiment, regardless of the configuration of command buffer 126, the first set 302 of I/O pins is configured to convey signals between the command buffer 126 and the one or more volatile memory devices.

At block 820, method 800 determines a configuration of command buffer 126 (e.g., a register clock driver (RCD) circuit). Depending on the embodiment, the configuration of command buffer 126 may be set in a number of different ways. For example, to determine the configuration, command buffer 126 may check the status of a fuse 710. In one embodiment, when fuse 710 has a first status (e.g., not blown), command buffer 126 is set to the first configuration and when fuse 710 has a second status (e.g., blown), command buffer 126 is set to the second configuration. In addition, to determine the configuration, command buffer 126 may detect a signal driven to a configuration pin 720. In one embodiment, when configuration pin 720 is driven with a first signal (e.g., a relatively low signal or a signal below a threshold), command buffer 126 is set to the first configuration and when configuration pin 720 has is driven with a second signal (e.g., a relatively high signal or a signal above a threshold), command buffer 126 is set to the second configuration. Furthermore, to determine the configuration, command buffer 126 may determine a value stored in CSR 730. In one embodiment, when a first value is stored in CSR 130, command buffer 126 is set to the first configuration and when a second value is stored in CSR 130, command buffer 126 is set to the second configuration. In one embodiment, the configuration is set at the time of manufacture of command buffer 126 and cannot be changed after command buffer has been implemented in a memory module.

If method 800 determines that command buffer 126 has a first configuration, at block 830, method 800 establishes a second communication interface 310 between a second set 304 of I/O pins of command buffer 126 and the one or more volatile memory devices, such as DRAM devices 124 on memory module 220. In the first configuration, the first set 302 of I/O pins and the second set 304 of I/O pins are both configured to convey signals between the command buffer 126 and one or more volatile memory devices, such as DRAM devices 124. In one embodiment, the first configuration may be used when the command buffer 126 is to be implemented in a DRAM DIMM, which may be one example of memory module 120, as shown in FIG. 1. When implemented, both the first set 302 of I/O pins (i.e., Pins 2-4 and 7-9) and the second set 304 of I/O pins (i.e., Pins 0-1 and 5-6) are coupled to DRAM devices 124.

If method 800 determines that command buffer 126 does not have the first configuration, and instead has the second configuration, at block 840, method 800 establishes a third communication interface 502 between the second set 304 of I/O pins of command buffer 126 and non-volatile memory controller 228 on memory module 220. In the second configuration, the first set 302 of I/O pins is configured to convey signals between the command buffer 126 and one or more volatile memory devices, such as DRAM devices 124, while the second set 304 of I/O pins is configured to convey signals between the command buffer 126 and non-volatile memory controller 228. In one embodiment, the second configuration may be used when the command buffer 126 is to be implemented in a non-volatile DIMM, which may be one example of memory module 220, as shown in FIG. 2. When implemented, the first set 302 of I/O pins (i.e., Pins 2-4 and 7-9) is coupled to DRAM devices 124 and the second set 304 of I/O pins (i.e., Pins 0-1 and 5-6) is coupled to non-volatile memory controller 228.

Although the operations of the methods herein are shown and described in a particular order, the order of the operations of each method may be altered so that certain operations may be performed in an inverse order or so that certain operation may be performed, at least in part, concurrently with other operations. In certain implementations, instructions or sub-operations of distinct operations may be in an intermittent and/or alternating manner.

It is to be understood that the above description is intended to be illustrative, and not restrictive. Many other implementations will be apparent to those of skill in the art upon reading and understanding the above description. The scope of the disclosure should, therefore, be determined with reference to the appended claims, along with the full scope of equivalents to which such claims are entitled.

In the above description, numerous details are set forth. It will be apparent, however, to one skilled in the art, that the aspects of the present disclosure may be practiced without these specific details. In some instances, well-known structures and devices are shown in block diagram form, rather than in detail, in order to avoid obscuring the present disclosure.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilising terms such as "receiving," "determining," "selecting," "storing," "setting," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present disclosure also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear as set forth in the description. In addition, aspects of the present disclosure are not described with reference to any particular programming language. It will be appreciated that a variety of programming languages may be used to implement the teachings of the present disclosure as described herein.

Aspects of the present disclosure may be provided as a computer program product, or software, that may include a machine-readable medium having stored thereon instructions, which may be used to program a computer system (or other electronic devices) to perform a process according to the present disclosure. A machine-readable medium includes any procedure for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.).

What is claimed is:

1. A buffer chip comprising:
   a first set of input/output (I/O) pins; and
   a second set of I/O pins;
   wherein the buffer chip is configurable to operate in one of a first mode or a second mode;
   wherein the first set of I/O pins and the second set of I/O pins are configured to convey first signals between the buffer chip and one or more volatile memory devices on a memory module when the buffer chip is configured to operate in the first mode; and
   wherein the first set of I/O pins is configured to convey the first signals between the buffer chip and the one or more volatile memory devices and the second set of I/O pins is configured to convey second signals between the buffer chip and a non-volatile memory controller coupled to one or more non-volatile memory devices on the memory module when the buffer chip is configured to operate in the second mode.

2. The buffer chip of claim 1, wherein the buffer chip is to receive host commands from a host memory controller external to the memory module.

3. The buffer chip of claim 1, further comprising a plurality of multiplexers configured to enable a unidirectional interface between the second set of I/O pins and the one or more volatile memory devices when the buffer chip is configured to operate in the first mode and to enable a bidirectional interface between the second set of I/O pins and the non-volatile memory controller when the buffer chip is configured to operate in the second mode.

4. The buffer chip of claim 1, further comprising:
   at least one fuse, wherein when the at least one fuse has a first status, the buffer is configured chip configured to operate in the first mode and when the at least one fuse has a second status, the buffer chip is configured to operate in the second mode.

5. The buffer chip of claim 1, further comprising:
   a configuration pin, wherein when the configuration pin is driven with a first signal, the buffer chip is configured to operate in the first mode and when the configuration pin is driven with a second signal, the buffer chip is configured to operate in the second mode.

6. The buffer chip of claim 1, further comprising:
   a control and status register (CSR), wherein when the CSR stores a first value, the buffer chip is configured to operate in the first mode and when the CSR stores a second value, the buffer chip is configured to operate in the second mode.

7. The buffer chip of claim 1, wherein the one or more volatile memory devices comprise dynamic random access memory (DRAM) devices, and wherein the first signals comprise storage commands directed to the DRAM devices.

8. The buffer chip of claim 1, wherein the one or more non-volatile memory devices comprise flash memory devices, and wherein the first signals comprise at least one of storage commands directed to the non-volatile memory devices, interrupts directed to the non-volatile memory controller, or requests for commands sent from the non-volatile memory controller to the command buffer.

9. A device comprising:
one or more volatile memory devices; and
a command buffer coupled to the one or more volatile memory devices, the command buffer to receive one or more host commands from a host memory controller, the command buffer comprising a first set of input/output (I/O) pins and a second set of I/O pins, wherein the first set of I/O pins and the second set of I/O pins are configured to convey first signals between the command buffer and the one or more volatile memory devices when the command buffer is set to a first configuration of a plurality of configurations and wherein the second set of I/O pins is configured to convey second signals between the command buffer and another component of the device when the command buffer is set to a second configuration of the plurality of configurations.

10. The device of claim 9, wherein the one or more volatile memory devices comprise dynamic random access memory (DRAM) devices.

11. The device of claim 9, further comprising:
one or more data buffers coupled to the one or more volatile memory devices and to the command buffer.

12. The device of claim 9, further comprising:
one or more non-volatile memory devices; and
a non-volatile memory controller coupled to the one or more non-volatile memory devices, wherein the command buffer is further coupled to the non-volatile memory controller.

13. The device of claim 12, wherein the first set of I/O pins is configured to convey the first signals between the command buffer and the one or more volatile memory devices and the second set of I/O pins is configured to convey the second signals between the command buffer and the non-volatile memory controller when the command buffer is set to the second configuration of the plurality of configurations.

14. The device of claim 13, wherein the command buffer comprises at least one fuse, wherein when the at least one fuse has a first status, the command buffer is set to the first configuration and when the at least one fuse has a second status, the command buffer is set to the second configuration.

15. The device of claim 13, wherein the command buffer comprises a configuration pin, wherein when the configuration pin is driven with a first signal, the command buffer is set to the first configuration and when the configuration pin is driven with a second signal, the command buffer is set to the second configuration.

16. The device of claim 13, wherein the command buffer comprises a control and status register (CSR), wherein when the CSR stores a first value, the command buffer is set to the first configuration and when the CSR stores a second value, the command buffer is set to the second configuration.

17. A method comprising:
determining a configuration of a register clock driver (RCD) circuit comprising a first set of input/output (I/O) pins and a second set of I/O pins;
establishing a first communication interface between the first set of I/O pins and one or more volatile memory devices on a memory module;
responsive to determining that the register clock driver circuit has a first configuration, establishing a second communication interface between the second set of I/O pins and the one or more volatile memory devices on the memory module; and
responsive to determining that the register clock driver circuit has a second configuration, establishing a third communication interface between the second set of I/O pins and a non-volatile memory controller on the memory module.

18. The method of claim 17, wherein determining a configuration of the RCD circuit comprises determining a status of at least one fuse on the RCD circuit, wherein when the at least one fuse has a first status, the RCD circuit has the first configuration and when the at least one fuse has a second status, the RCD circuit has the second configuration.

19. The method of claim 17, wherein determining a configuration of the RCD circuit comprises detecting a signal driven to a configuration pin of the RCD circuit, wherein when the configuration pin is driven with a first signal, the RCD circuit has the first configuration and when the configuration pin is driven with a second signal, the RCD circuit has the second configuration.

20. The method of claim 17, determining a configuration of the RCD circuit comprises determining a value stored in a control and status register (CSR), wherein when the CSR stores a first value, the RCD circuit has the first configuration and when the CSR stores a second value, the RCD circuit has the second configuration.

* * * * *